(12) United States Patent
Creutzburg et al.

(10) Patent No.: US 6,647,324 B2
(45) Date of Patent: Nov. 11, 2003

(54) METHOD FOR DIGITALLY FILTERING A SIGNAL BURDENED WITH NOISE AND A CONTROL SYSTEM FOR A VEHICLE

(75) Inventors: Uwe Creutzburg, Hannover (DE); Hermann Hoinkaus, Burgwedel/Fuhrberg (DE); Andreas Rieckmann, Hannover (DE)

(73) Assignee: Continental Aktiengesellschaft, Hannover (DE)

(*) Notice: Subject to any disclaimer, the term of this patent is extended or adjusted under 35 U.S.C. 154(b) by 0 days.

(21) Appl. No.: 10/347,316

(22) Filed: Jan. 21, 2003

(65) Prior Publication Data

US 2003/0139856 A1 Jul. 24, 2003

(30) Foreign Application Priority Data

Jan. 19, 2002 (DE) .......................... 102 01 902

(51) Int. Cl.[7] ............................................. G06F 7/00
(52) U.S. Cl. ........................... 701/1; 701/36; 381/71.1
(58) Field of Search .......................... 701/1, 36, 37, 701/38, 41, 42, 65, 68; 370/290; 73/117.2, 117.3; 381/71.1, 71.4, 71.3

(56) References Cited

U.S. PATENT DOCUMENTS

| | | | | | |
|---|---|---|---|---|---|
| 5,416,844 | A | * | 5/1995 | Nakaji et al. | 381/71 |
| 5,559,893 | A | * | 9/1996 | Krokstad et al. | 381/71 |
| 5,875,411 | A | * | 2/1999 | Volkart et al. | 73/117.3 |
| 6,185,300 | B1 | * | 2/2001 | Romsburg | 370/290 |

* cited by examiner

*Primary Examiner*—Richard M. Camby
(74) *Attorney, Agent, or Firm*—Walter Ottesen

(57) ABSTRACT

A noise-burdened signal is filtered in accordance with a method of digitally filtering to filter out the noise component. The method includes inputting a signal into a digital filter of a filter length (K+1) wherein the filter length is less than the period of the fundamental frequency of the signal. A signal component of an order (m) is filtered from the signal based on earlier scanning values of the signal within the filter length. A filtered signal value is then outputted.

18 Claims, 5 Drawing Sheets

METHOD FOR DIGITALLY FILTERING A SIGNAL BURDENED WITH NOISE AND A CONTROL SYSTEM FOR A VEHICLE

FIELD OF THE INVENTION

The invention relates to a method for digitally filtering a signal burdened with noise for the purpose of filtering out the noise components, especially to determine a zero crossover of the signal. The invention also relates to a method for controlling the driving dynamic of a vehicle and a corresponding computer program and control system.

BACKGROUND OF THE INVENTION

Various methods for digitally filtering are known from the state of the art, especially the so-called Butterworth filter. Furthermore, so-called adaptive and predictive filters are known from the state of the art.

Also known from the state of the art are digital filters for the lowpass filtering of signals burdened with noise for filtering out the noise components. A common disadvantage of such digital filters is the phase shift of the filtered signal generated by the filtering with reference to the original signal. This phase shift is especially disadvantageous for control applications because a precise phase position is important. This applies also to control applications for vehicles, especially motor vehicles.

German patent publication 4,112,007 discloses a system for forming a signal for the chassis control of a vehicle wherein the relative movements between the vehicle body and the wheels are detected. Proceeding from this, the predicted spring deflection velocity at a future time point is determined. Based on this, the control of a vehicle variable is undertaken such as the control of adjustably designed dampers. The object is to adjust the damper characteristic in operating phases of lesser damping forces of the damper in order to minimize the adjusting noise of the damping.

It is here disadvantageous that a Taylor series development is used for predicting the spring deflection velocity. Such a Taylor series development is based, by definition, on derivations which intensify the noise component in the signal. For this reason, the series development must be interrupted early in this application so that only a very small number of support points can be considered. Furthermore, in this method, it is assumed that the considered support points are "true" (that is, not noise-burdened) signal values so that measuring inaccuracies lead to massive effects on the prediction.

SUMMARY OF THE INVENTION

It is an object of the invention to provide an improved method for digitally filtering a noise-containing signal by filtering out the noise component. It is a further object of the invention to provide an improved method for controlling the driving dynamic of a vehicle and to provide a corresponding computer program and control system.

The method of the invention for digitally filtering a noise-containing signal is for filtering out components of noise. The signal has a fundamental frequency and the method includes the steps of: inputting the noise-containing signal into a digital filter having a filter length (K) less than the period of the fundamental frequency; filtering out a signal component of an order (m) from the signal based on earlier scanning values of the signal within the filter length (K); and, outputting a filtered signal value.

A special advantage of the invention is that the filtered signal has only a slight or no phase shift with reference to the unfiltered noise-burdened signal. This applies especially to the filtering of the linearly approximated signal trace so that the time point of the crossover of the noise-burdened signal through a specific signal level can be especially precisely determined by evaluating the filtered signal. In this way, especially the time point of the zero crossover can be precisely determined.

A further special advantage of the invention is that an FIR filter (finite-pulse response) can be used so that the filter is stable in every case.

According to a preferred embodiment of the invention, an FIR filter of a specific filter length is used which is significantly less than the period of the fundamental frequency of the signal to be filtered. For example, the filter length is selected as $\frac{1}{5}$ or as $\frac{1}{10}$ of the period of the fundamental frequency.

This is especially advantageous for such signals which are based on a vibration system since these signals, in general, contain a strong harmonic component of the fundamental frequency and this harmonic component can be linearly approximated in the region of the zero crossover. For such signals, a corresponding design of the filter for filtering out the linear signal component is advantageous so that the zero crossover of the signal can be determined especially accurately.

According to another preferred embodiment of the invention, the filtering takes place via interpolation based on earlier scanning values within a window length pregiven by the filter length. Alternatively or in addition thereto, the filtering takes place via extrapolation based on the same scanning values in order to arrive at an extrapolated future signal value. The extrapolation can be especially used to estimate future signal values, for example, the zero crossover or to compute signal values for specific earlier or future time points.

According to a further preferred embodiment of the invention, the filtering of a nonlinear signal component takes place such as a signal component of quadratic or higher order. For filtering out signal components of quadratic order, a quadratic interpolation algorithm is used in order to filter out corresponding nonlinear signal traces.

According to a further preferred embodiment of the invention, the filter length for filtering out a linear signal component is so selected that the signal trace of the signal, which is to be filtered, has essentially a linear trace within a relevant range. For a vibration signal, this applies to the region about the zero crossover of the signal and this crossover can be approximated via a linear function.

According to a preferred embodiment of the invention, the method of the invention for digitally filtering is used as a basis for the control of one or several driving-dynamic parameters of a vehicle. For the control of the damping, for example, the input signals from elevation position sensors are detected at specific scanning time points and the corresponding noise-containing signal is filtered and supplied to the control algorithm. For example, the control of the damping characteristic takes place adaptively based on the detection of the zero crossover of the signal.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
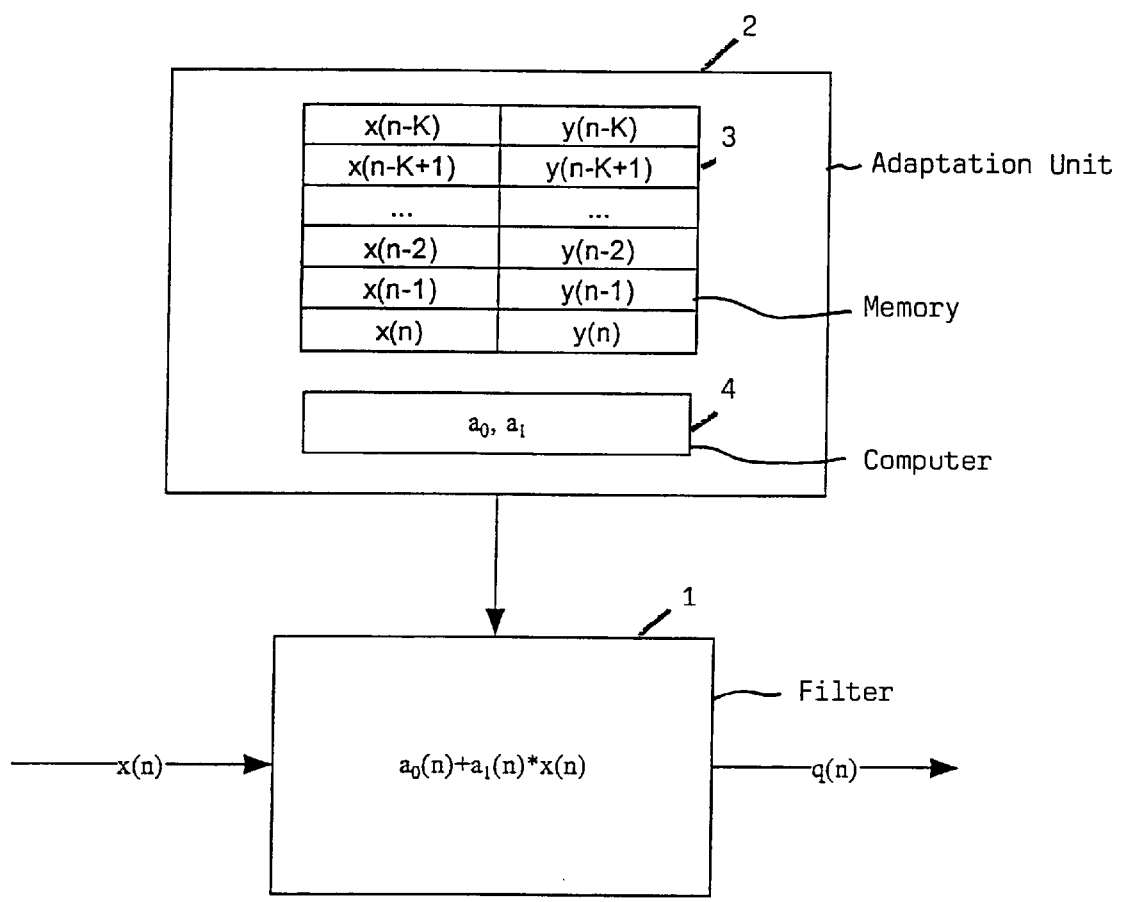
FIG. 1 is a block diagram of a digital filter according to an embodiment of the invention.

FIG. 1 shows a linear adaptive FIR filter 1 having the filter function:

$$a_0(n)+a_1(n)*x(n)$$

wherein:

x(n) is the n-th scanning time point;

$a_0(n)$ is a filter parameter $a_0$ for the n-th scanning time point; and, $a_1(n)$ is a filter parameter $a_1$ for the n-th scanning time point.

The filtered signal value is the output of filter 1 and is identified by q(n).

The filter parameters $a_0(n)$ and $a_1(n)$ are newly computed for each computation of a filtered signal value q(n). The adaptation unit 2 functions to carry out this computation and includes a memory 3 and a computer 4. The memory 3 functions to store instantaneous and earlier scanning time points x(n), x(n–1), . . . . . . x(n–K) and earlier scanning values of the noise-containing signal y(n), y(n–1) . . . . . . y(n–K). In the memory 3, K earlier scanning time points and scanning values are therefore stored. This corresponds, at the same time, to a filter length of K, that is, the filter length results from K·$T_s$ wherein $T_s$ is the scanning time.

From the earlier scanning time points x and the earlier scanning values y of the memory 3, the filter parameters $a_0$ and $a_1$ are determined with the computer 4 for the computation of the n-th filtered signal value q(n). For the computation of a subsequent (n+1)-th signal value q(n+1), the oldest earlier scanning time points x(n–K) and scanning values y(n–K) are erased from the memory 3 and the instantaneous scanning time point x(n+1) and scanning value y(n+1) are inputted into the memory 3 so that the computation of the filter parameters $a_0$ and $a_1$ can take place in the computer 4 based on this adapted set of earlier scanning time points and scanning values.

A linear signal component is filtered from the scanning values y(n) of the noise-containing signal by means of the filter function of FIG. 1. The filtered signal value q(n) at the n-th time point results from interpolation of the earlier scanning time points and the scanning values of the filter length.

Additionally, or alternatively, the future signal value q(n+i) can be computed by extrapolation in addition to the computation of the n-th filtered signal value q(n). For this purpose, the filter parameters $a_0$ and $a_1$ at the n-th time point are used. This means that the filtered signal value q(n+i) results by extrapolation, based on the scanning time points and scanning values which are earlier behind the n-th time point.

For example, in the range of the zero crossover of a noise-containing sine-shaped signal, such an extrapolation supplies relatively precise results because the fundamental harmonic of the signal is approximately sinusoidal in shape and can therefore be linearly approximated. In this way, it is possible to, for example, predict the time point of the zero crossover. The predicted zero crossover can also serve as an input variable for a control, for example, of the driving dynamic of a vehicle.

For filtering out signal components of higher order, the filter function of filter 1 must be correspondingly expanded. A filter function in the form of a polynomial of the m-th order is needed for filtering out signal components of the m-th order.

For the linear function of the filter 1, the filter parameters $a_0$ and $a_1$ can be computed by the computer 4, based on the earlier scanning time points x and scanning values y stored in the memory 3, as follows:

$$a_0(n) = \frac{\sum_{k=0}^{K} y(n-k) \sum_{k=0}^{K} x^2(n-k) - \sum_{k=0}^{K} x(n-k) \sum_{k=0}^{K} [x(n-k)y(n-k)]}{D(n)}$$

$$a_1(n) = \frac{K \sum_{k=0}^{K} [x(n-k)y(n-k)] - \sum_{k=0}^{K} x(n-k) \sum_{k=0}^{K} y(n-k)}{D(n)} \text{ wherein}$$

$$D(n) = K \sum_{k=0}^{K} x^2(n-k) - \left[\sum_{k=0}^{K} x(n-k)\right]^2$$

Figure 2:
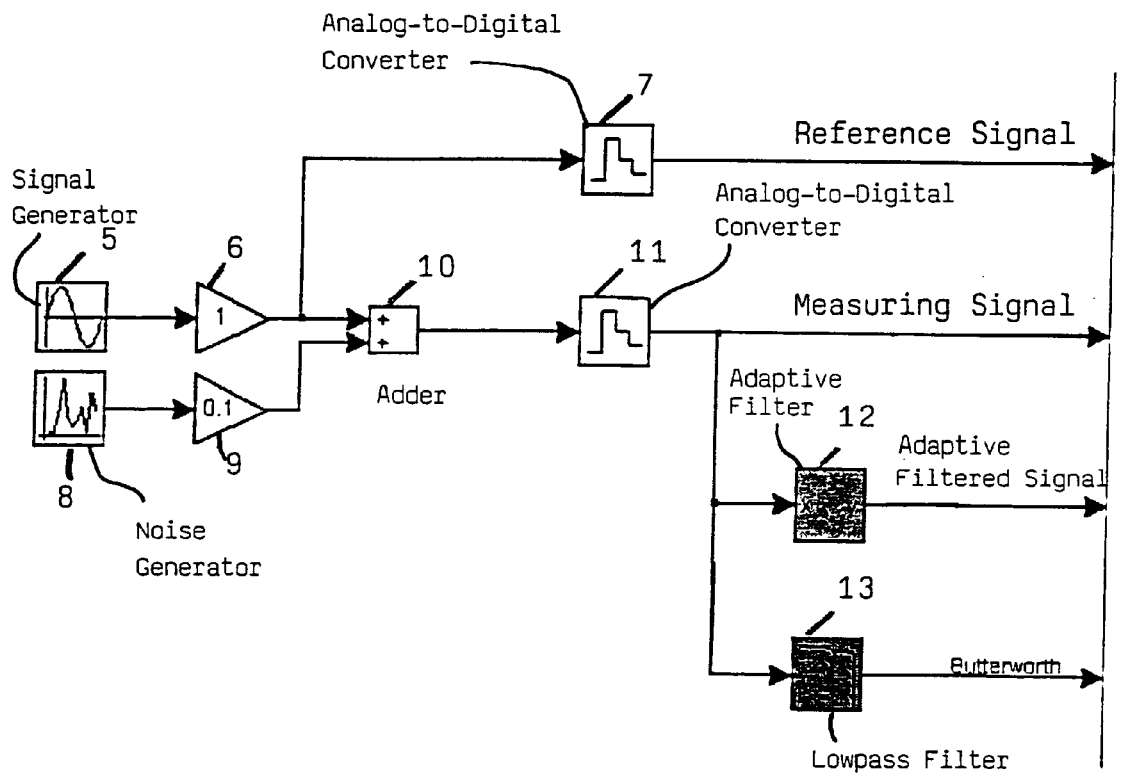
FIG. 2 is a block diagram of a test system for showing the operation of the digital filter of the invention.

FIG. 2 is a schematic of a test system for showing the operation of the filter 1 of FIG. 1. The test system includes a signal generator 5 for generating a sinusoidally-shaped signal. This sinusoidally-shaped signal is weighted in the amplifier 6 by the amplification factor 1 and is scanned by the analog-to-digital converter 7. From this, the reference signal "reference" results.

The test system further has a noise generator 8. The noise, which is generated by the noise generator 8, is weighted by the amplifier 9 by the factor 0.1. The output signals of the amplifiers 6 and 9 are added in the adder 10 and, thereafter, are scanned by the analog-to-digital converter 11. From this, the signal identified as "measuring signal" results. This signal corresponds to a noise-containing signal outputted by a sensor, for example, in a motor vehicle.

The noise-containing measuring signal is supplied to the adaptive filter 12 which corresponds in its assembly and operation to the filter explained with respect to FIG. 1. This filter outputs the filter signal "adaptive". Furthermore, the measuring signal is also inputted into a lowpass filter 13. This lowpass filter 13 is a Butterworth filter known from the state of the art.

Figure 3:
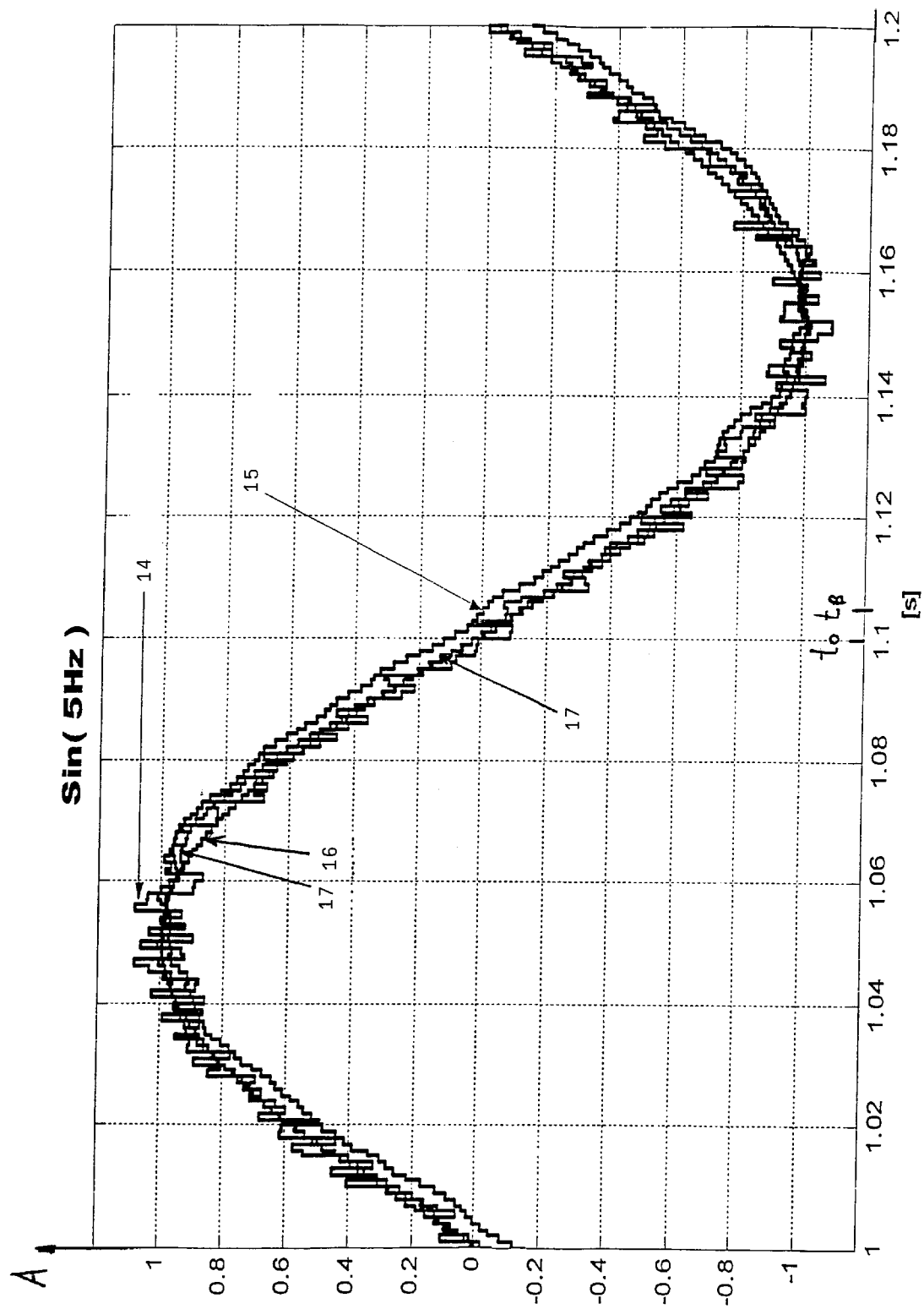
FIG. 3 shows the traces of signals in the test system of FIG. 2.

The corresponding signal traces are shown in FIG. 3. The noise-containing measuring signal is identified as signal 14 in FIG. 3. The output signal of the Butterworth filter 13 is identified by reference numeral 15 in FIG. 3. The reference signal is identified in FIG. 3 by reference numeral 16 and the output signal "adaptive" of the filter 12 is identified in FIG. 3 by reference numeral 17.

The signals 17 and 16 are substantially coincident especially in the region about zero crossover so that the time point of the zero crossover to of the filtered signal 17 corresponds to that of the reference signal 16. In contrast, the signal 15 (that is, the output signal of the Butterworth lowpass filter 13) has a clear phase shift compared to the reference signal. The zero crossover of signal 15 is at a time point $t_B$ significantly after the actual zero crossover at time point $t_0$. The adaptive filtered signal 17 is superior to the signal 15 filtered by the Butterworth filter even in the signal ranges outside of zero crossover and has a better approximation to the reference signal 16, especially, the signal 17 has a lesser phase shift.

Figure 4:
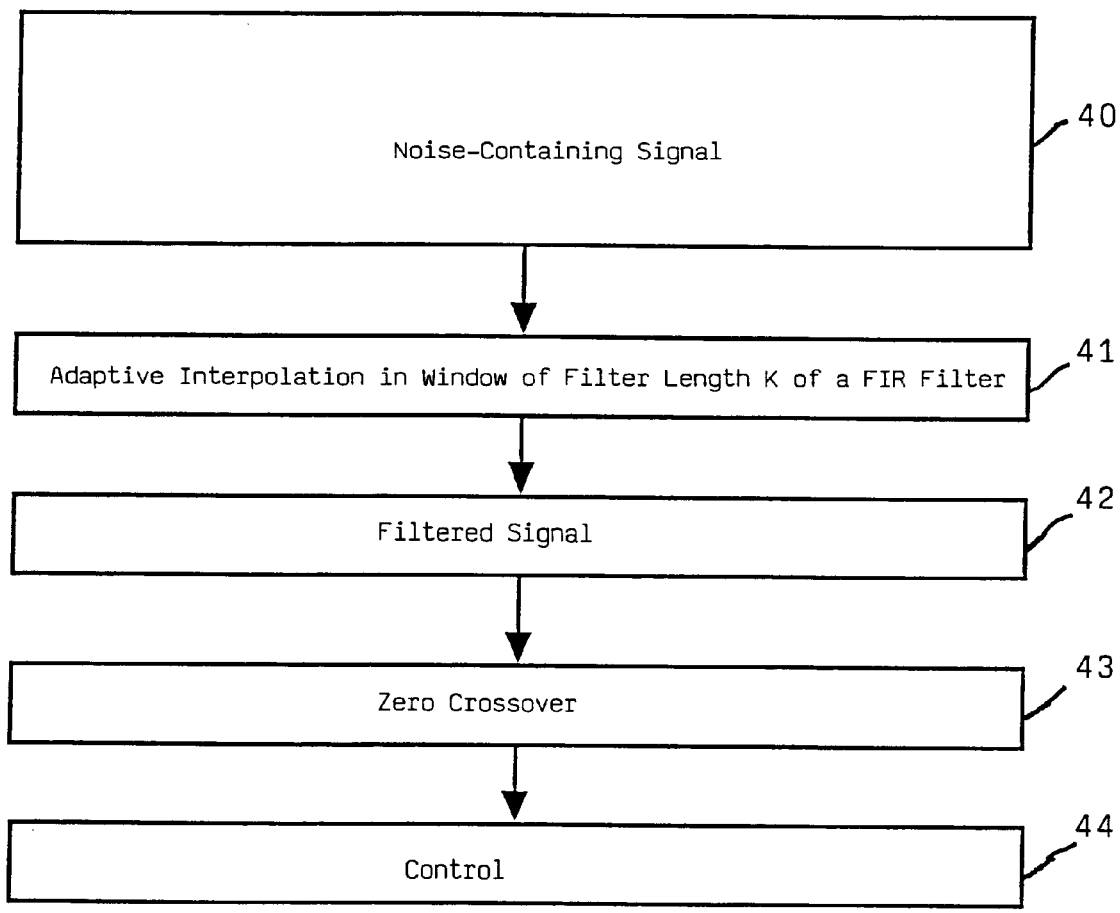
FIG. 4 is a flowchart showing an embodiment of the method of the invention for carrying out a control based on the detection of the zero crossover; and, FIG. 5 is a schematic of a control system according to the invention for a motor vehicle.

FIG. 4 shows an embodiment of the control method according to the invention.

In step 40, a noise-burdened signal is inputted and can, for example, originate from a sensor. This signal is filtered by a filter of the type shown in FIG. 1 and, more specifically, is filtered via adaptive interpolation based on a window of earlier values of the filter length K.

The correspondingly filtered signal is outputted in step 42. In step 43, a zero crossover is determined for the filtered signal. The time point of the zero crossover of the filtered signal is supplied to a control in step 44 which, based on this time point, undertakes a control, for example, of the damping of a vehicle damper.

In addition to the interpolation, an extrapolation is also possible as explained above with respect to FIG. 1. With extrapolation, the trace of the filtered signal in step 43 can be predicted, in this case, the zero crossover. The predicted time point (for example, of the zero crossover) can then be alternatively or additionally used for the control in step 44.

Figure 5:
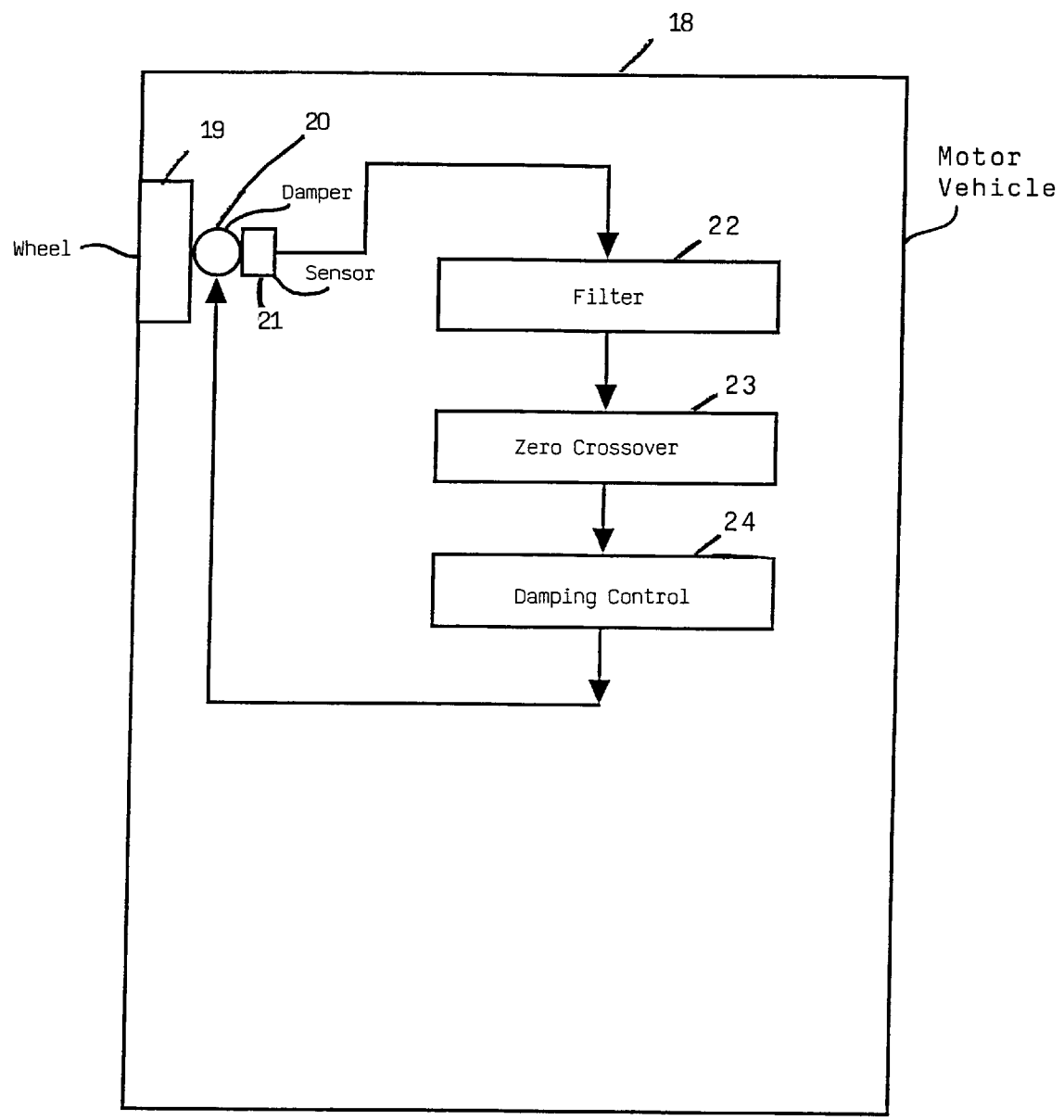

FIG. 5 shows an application of the digital filtering method for a motor vehicle 18. The motor vehicle 18 has a damper 20 on each wheel 19. The elevation of the damper 20 is detected by a sensor 21 which outputs a corresponding output signal. This output signal typically includes noise components. The output signal of the sensor 21 is inputted into a filter 22 which corresponds in configuration and operation to the filter of FIG. 1. The filtered signal value, which is outputted from the filter 22, is inputted into the zero crossover detector 23 which determines the instantaneous and/or future zero crossover of the signal based on the filtered signal value.

The instantaneous and/or future time point of the zero crossover is inputted into the damping control 24 by the zero crossover detector 23. The damping control 24 correspondingly readjusts one or several damping parameters of the damper 20.

This method can also be used in the same manner in order to detect signal levels other than zero crossover.

It is understood that the foregoing description is that of the preferred embodiments of the invention and that various changes and modifications may be made thereto without departing from the spirit and scope of the invention as defined in the appended claims.

What is claimed is:

1. A method for digitally filtering a noise-containing signal for filtering out components of noise, the signal having a fundamental frequency and the method comprising the steps of:

inputting said noise-containing signal into a digital filter having a filter length (K) less than the period of said fundamental frequency;

filtering out a signal component of an order (m) from said signal based on earlier scanning values of said signal within said filter length (K); and, outputting a filtered signal value.

2. The method of claim 1, wherein said filter length (K) is less than ¼ of the period of said fundamental frequency.

3. The method of claim 1, wherein said filter length (K) is less than ⅕ of the period of said fundamental frequency.

4. The method of claim 1, wherein said filter length (K) is ¹⁄₁₀ of the period of said fundamental frequency.

5. The method of claim 1, wherein said signal component is a linear signal component.

6. The method of claim 1, wherein said filtered signal value is a signal value interpolated from said earlier scanning values.

7. The method of claim 1, wherein said filtered signal value is a signal value extrapolated from said earlier scanning values.

8. The method of claim 1, comprising the further steps of:

scanning said signal at discrete time points (x(n));

utilizing a linear adaptive filter for filtering out said signal component with said linear adaptive filter having a filter coefficient; and, utilizing a memory for computing said filter coefficient of said linear adaptive filter with said memory containing said earlier scanning values and discrete time points within said filter length (K).

9. The method of claim 1, comprising the further step of determining a zero crossover of said noise-containing signal utilizing the filtered signal values.

10. The method of claim 1, wherein said noise-containing signal is the output signal of a sensor for a vibrating system.

11. The method of claim 10, wherein said vibrating system is a motor vehicle.

12. A method of controlling the driving dynamic of a vehicle, the method comprising the steps of:

filtering an output signal of a sensor for detecting a vibration of the vehicle by carrying out the following steps:
(a) inputting said noise-containing signal into a digital filter having a filter length (K) less than the period of said fundamental frequency;
(b) filtering out a signal component of an order (m) from said signal based on earlier scanning values of said signal within said filter length (K); and,
(c) outputting a filtered signal value;

determining a time point of reaching a pregiven value of said output signal utilizing the filtered signal values; and, controlling one or several driving-dynamic parameters of said vehicle based on said time point.

13. The method of claim 12, wherein said pregiven value of said output signal corresponds to a zero crossover.

14. The method of claim 12, wherein said parameter is the damping of a damper of said vehicle.

15. A computer program comprising a method for digitally filtering a noise-containing signal for filtering out components of noise, the signal having a fundamental frequency and the method comprising the steps of:

inputting said noise-containing signal into a digital filter having a filter length (K) less than the period of said fundamental frequency;

filtering out a signal component of an order (m) from said signal based on earlier scanning values of said signal within said filter length (K); and, outputting a filtered signal value.

16. A control system for at least one driving-dynamic parameter of a vehicle, the control system comprising:

a sensor for detecting a vibration of said vehicle or a component of said vehicle and for outputting an output signal indicative of said vibration;

computer means for carrying out a method for digitally filtering said output signal in accordance with a method including the steps of: inputting said noise-containing signal into a digital filter having a filter length (K) less than the period of said fundamental frequency; filtering out a signal component of an order (m) from said signal based on earlier scanning values of said signal within said filter length (K); and, outputting a filtered signal value;

said computer means also functioning to determine a time point of reaching a pregiven value of said output signal utilizing said filtered signal value; and, control means for controlling one or several driving-dynamic parameters of said vehicle based on the determination of said time point.

17. The control system of claim 16, wherein said pregiven value corresponds to a zero crossover.

18. The control system of claim 16, wherein said parameter is the damping of a damper of said vehicle.

* * * * *